United States Patent [19]

Karr et al.

[11] Patent Number: 5,170,087
[45] Date of Patent: Dec. 8, 1992

[54] ELECTRONIC CIRCUIT FOR PIEZOELECTRIC SWITCH ASSEMBLY

[75] Inventors: Barrett Karr, Las Tunas; Thomas Walker, Ojai, both of Calif.

[73] Assignee: Touch Tec International, Mt. Clemens, Mich.

[21] Appl. No.: 750,066

[22] Filed: Aug. 26, 1991

[51] Int. Cl.⁵ .................................... H01L 41/08
[52] U.S. Cl. .................. 310/319; 310/339; 310/324; 200/181
[58] Field of Search ............. 310/338, 339, 319, 324; 341/34; 200/181

[56] References Cited

U.S. PATENT DOCUMENTS

| | | | |
|---|---|---|---|
| 3,339,104 | 8/1967 | Kushner et al. | 310/319 X |
| 4,185,621 | 1/1980 | Morrow | 310/319 X |
| 4,253,095 | 2/1981 | Schwartz et al. | 310/319 X |
| 4,379,245 | 4/1983 | Goldstein | 310/319 |
| 4,542,325 | 9/1985 | Kobayashi et al. | 310/324 X |
| 4,706,069 | 11/1987 | Tom et al. | 310/319 X |
| 4,714,846 | 12/1987 | Pesque et al. | 310/319 X |
| 4,761,582 | 8/1988 | McKee | 310/324 X |
| 4,820,953 | 4/1989 | Saubolle et al. | 310/338 |
| 4,853,580 | 8/1989 | Sula | 310/319 X |
| 5,034,648 | 7/1991 | Gastgeb | 310/319 X |

*Primary Examiner*—Mark O. Budd
*Attorney, Agent, or Firm*—Krass & Young

[57] ABSTRACT

An electronic circuit for a contactless, piezoelectric switch assembly. The piezoelectric switch assembly includes a piezoelectric module which generates voltages under manual pressure and electronic circuit operative to perform a predetermined switch function upon receipt of these electrical signals. The electronic circuit performs a variety of switching functions, such as: toggle on and off; dimmer setting; momentary on. The sensing means of the electronic circuit is coupled to the piezoelectric module via a reference voltage and a negative current source that pulls one terminal of the piezoelectric module toward the reference voltage. A slew rate limited buffer amplifier drives a comparator with hysteresis achieved by changing the comparison voltage. This hysteresis serves to reduce detection of jitter and noise in the initial application of pressure. In the momentary on mode the reference voltage supplied to the piezoelectric module is above the second threshold of the comparator when initial manual pressure is detected. This causes the comparator to remain tripped. Upon release of pressure on the piezoelectric module, a piezoelectric signal of the opposite polarity causes the comparator to reset. In order to prevent hang up, a timer returns the reference voltage to its original level after a predetermined time.

20 Claims, 8 Drawing Sheets

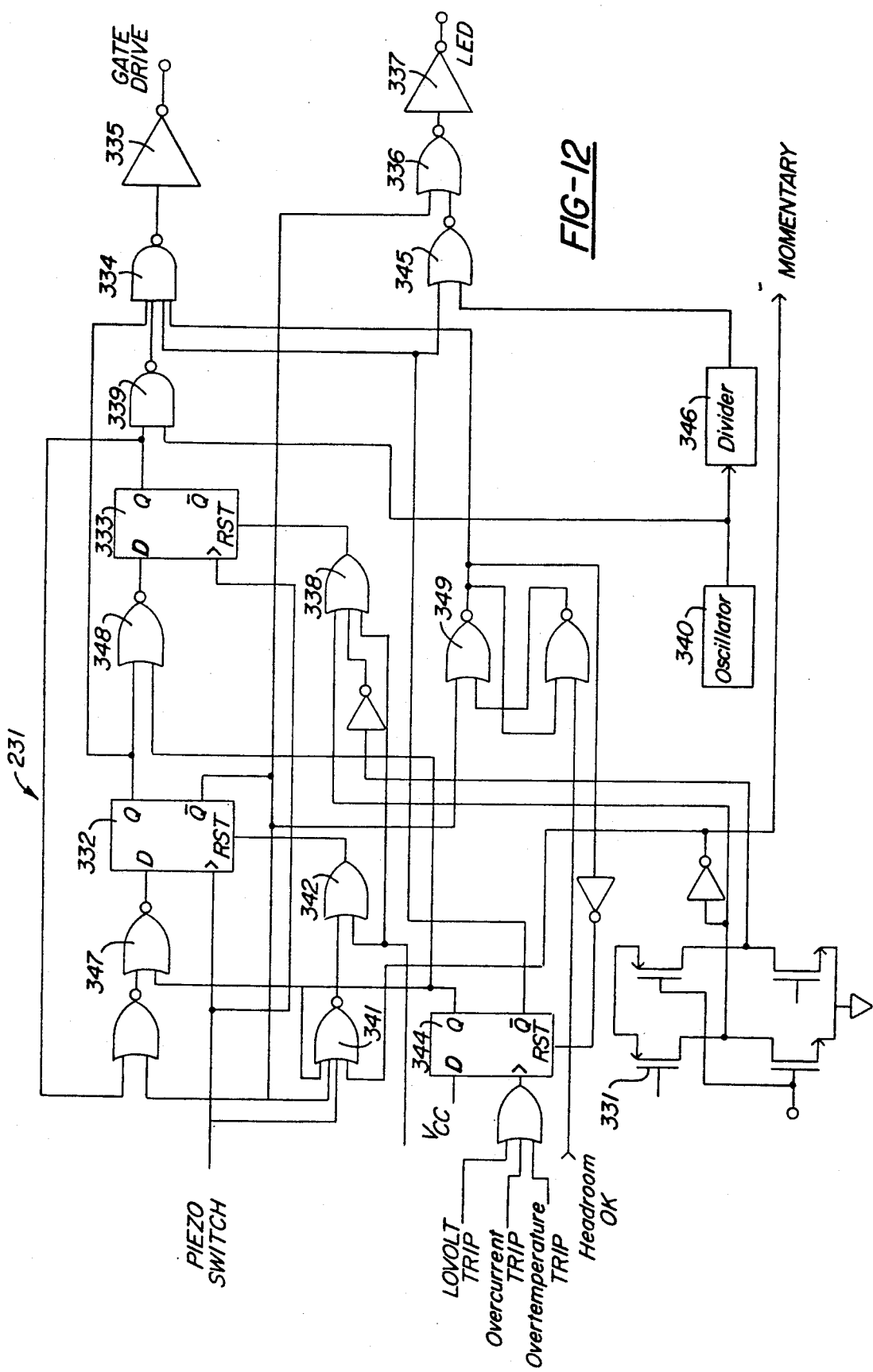

ELECTRONIC CIRCUIT FOR PIEZOELECTRIC SWITCH ASSEMBLY

BACKGROUND OF THE INVENTION

1. Field of the Invention

This invention relates generally to electronic switches having no moving contacts, and more specifically, to such electronic switches utilizing a switching signal generated by deformation of a piezoelectric material.

2. Description of the Prior Art

Contactless piezoelectric switches are known in the prior art. Typically, such switches employ a deformable face or surface, and a thin body of piezoelectric material arranged such that a deforming force is transmitted from the face or surface to the piezoelectric material, thus causing the material to generate an electrical signal. Electrodes are employed in conjunction with the body of piezoelectric material so that the electrical signal may be communicated to, for example, switch circuitry. Thus, when the deformable face is pressed by the user, the piezoelectric material generates an electrical signal and activates the switching circuit. Such switches are disclosed in, for example, U.S. Pat. Nos. 3,339,104 and 4,618,797.

Such contactless switches have inherent advantages over conventional switches with moving parts in that they can be made vandal-proof and are much less sensitive to environmental degradation. They have no moving parts or electrical contacts to wear out, and produce no electrical arc or electromagnetic interference, a great benefit in explosive or sensitive electronic environments.

However, the piezoelectric contactless switches of the prior art suffer from certain disadvantages. Prior art piezoelectric switches have limited control functions. They are generally limited to simple on and off switching. In addition the sensing of operation of prior art piezoelectric contactless switches tends to be unreliable due to the numerous sources of noise in the signal from the piezoelectric element.

It would be desirable to provide a contactless, piezoelectric switch assembly which can provide a number of switch functions is a reliable manner.

SUMMARY OF THE INVENTION

This application teaches a contactless, piezoelectric switch assembly. The piezoelectric switch assembly includes a piezoelectric module which generates voltages under manual pressure and electronic circuit operative to perform a predetermined switch function upon receipt of electrical signals generated by the piezoelectric module. The electronic circuit may be configured to perform a variety of switching functions, such as toggle on and off, dimmer setting, momentary, etc., or may combine one or more of these and/or other switch functions.

The electronic circuit of the piezoelectric switch of this application includes a sensing means for detection of the electrical signal generated by the piezoelectric module. The sensing means is coupled to the piezoelectric module via a reference voltage and a negative current source that pulls one terminal of the piezoelectric module toward the reference voltage. A slew rate limited buffer amplifier receives the signal produced by the piezoelectric module. This buffer amplifier drives a comparator with hysteresis achieved by changing the comparison voltage. Initially the comparison voltage is about 0.7 volts above the reference voltage. When the comparator trips the comparison voltage is shifted downward to about 0.5 volts above the reference voltage. This hysteresis serves to reduce detection of jitter and noise in the initial application of pressure to the piezoelectric module.

The electronic circuit includes a toggle means connected to the sensing means and having a plurality of states. Depending on the mode enabled, the toggle means changes between the states in a predetermined order based on the detected signal from the piezoelectric module. This toggle means controls a switch which performs the enabled switch function.

In the preferred embodiment three modes are enabled: an OFF/ON mode; an OFF/DIM/ON mode; and a MOMENTARY mode. In the OFF/ON mode each detected pressure on the piezoelectric module toggles the switch from off to on. In the OFF/DIM/ON mode the switch advances between off, dim and on states on each detected pressure on the piezoelectric module. In the dim state the switch is periodically switched on and off to conduct current at a reduced average rate than when on.

In the MOMENTARY mode the switch changes from being off to on upon each manual force imposed on the piezoelectric module and changes from on back to off upon release of the manual force imposed on the piezoelectric module. In the MOMENTARY mode the reference voltage supplied to one terminal of the piezoelectric module to above the second threshold of the comparator when initial manual pressure is detected. This causes the comparator to remain tripped even after the initial signal leaks away from the piezoelectric module. Upon release of pressure on the piezoelectric module, a signal of the opposite polarity is generated. This negative signal is sufficient to cause the comparator to reset. Resetting the comparator returns the reference voltage to its original level and selects the initial, higher comparison voltage at the comparator. In order to prevent hang up, a timer returns the reference voltage to its original level a predetermined time after the comparator ins initially tripped in the MOMENTARY mode. This insures that the piezoelectric switch eventually returns to the off state.

BRIEF DESCRIPTION OF THE DRAWINGS

The following detailed description may best be understood by reference to the following drawings in which:

FIG. 12 ia a schematic diagram of the logic circuit portion of the special purpose integrated circuit illustrated in FIG. 7.

DETAILED DESCRIPTION OF THE PREFERRED EMBODIMENTS

Figure 1:
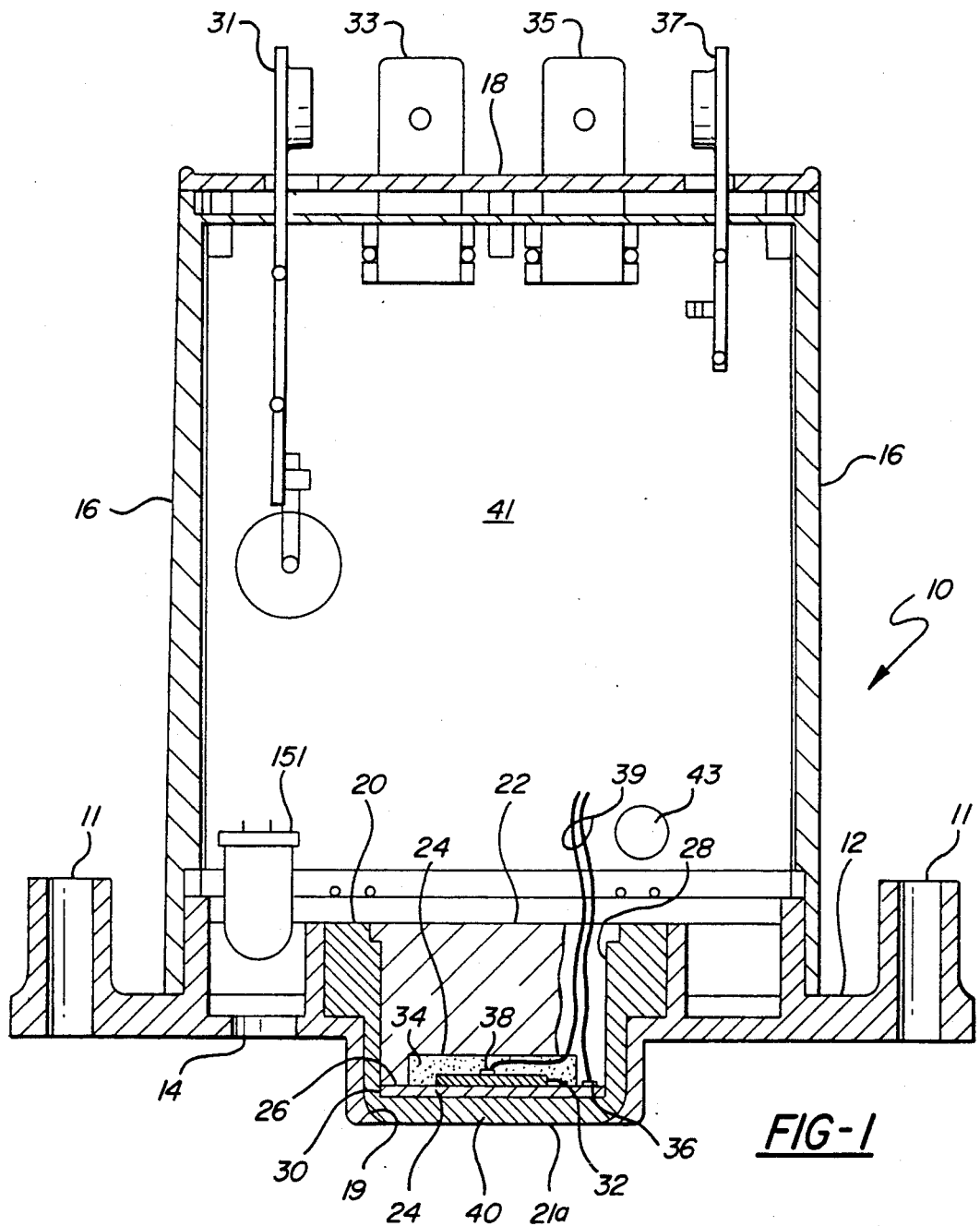
FIG. 1 is a side sectional view of a switch assembly constructed in accordance with the principles of the present invention.

Throughout the following detailed description, like reference numerals are used to refer to the same element of the device shown in multiple figures thereof.

Figure 2:
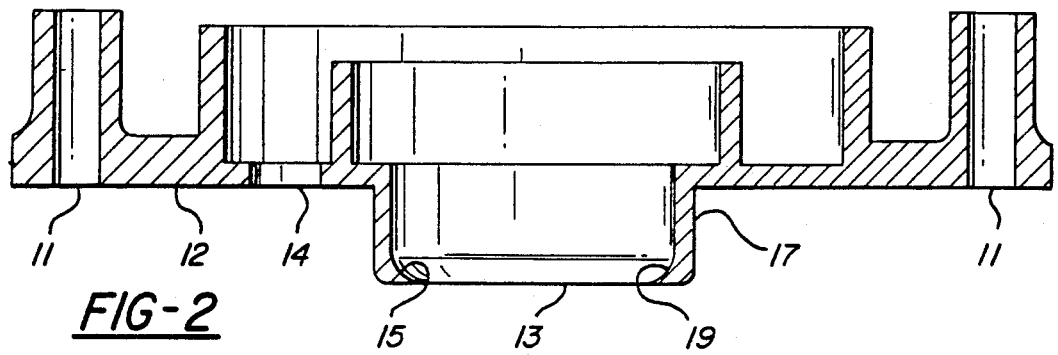
FIG. 2 is a side sectional view of the front member of the switch assembly shown in FIG. 1.

Referring now to the drawings and in particular to FIG. 1, there is depicted a piezoelectric switch assembly 10 constructed according to the principles of the present invention. The switch assembly 10 is housed inside a housing including side walls 16 and back plate 18. Front member 12, best seen in FIG. 2, is deposed on the front of the housing and includes a circular aperture 13 which defines a peripheral edge 15. In a preferred embodiment, aperture 13 and peripheral edge 5 are defined by, respectively, peripheral side wall 17 which projects from a front surface of front member 12, and an annular lip 19 which tapers inwardly from the front surface. Front member 12 is attachable to a control panel (not illustrated) incorporating switch assembly 10 via bolt holes 11.

A cup-shaped insert 20 having a pressure receiving front wall 21 formed thereon is configured to be received in the aperture 13 such that an exterior surface 21a of the wall 21 is approximately flush with the peripheral edge 15 of the aperture 13. The insert 20 further includes means forming a cylindrical chamber 23 opening onto a rear surface thereof. In a preferred embodiment, cup-shaped insert 20 further includes a projecting, peripheral side wall 25 which has pressure receiving front wall 21 formed thereon, the junction between the peripheral side wall 25 and the front wall 21 forming a tapered seating surface 27 such that, when socket 20 is inserted into aperture 13 of front member 12, the exterior surface 21a of pressure receiving front wall 21 positively seats flush with the front surface of front member 12 in the manner depicted in FIG. 1.

Figure 3:
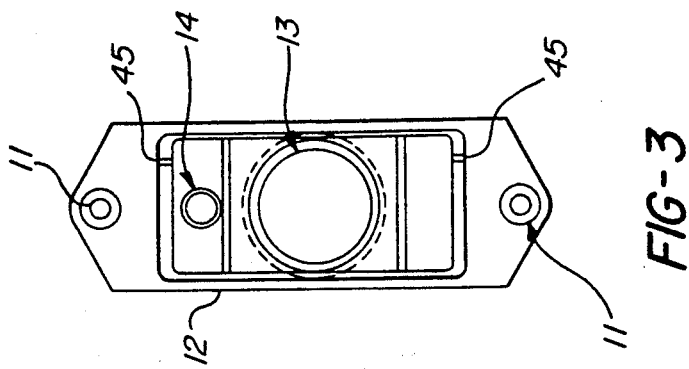
FIG. 3 is an end view of the front member of the switch assembly shown in FIG. 1.

Electronics for switch assembly 10 are mounted on a circuit board 41 disposed within the interior space between front member 12, side walls 16 and back plate 18. The switch assembly 10 is electrically connected via plural electrical connectors 31, 33, 35 and 37. Referring to the interior end view of front panel 12 of FIG. 3, circuit board 41 is secured at its front end by insertion into slots 45 of front panel 12. Circuit board 41 is secured at its read end via electrical connectors 31, 33, 35 and 37 which protrude through corresponding holes in back panel 18. Circuit board 41 includes light emitting diode 151 disposed at the near end. Light emitting diode 151 is disposed to be visible through opening 14 in front panel 12. In addition, one or more lamps 43 are disposed at the near end of circuit board 41 near socket 20. Other electronic circuits of switch assembly 10 will be more fully described below in conjunction with FIGS. 7 to 12.

Figure 5A:
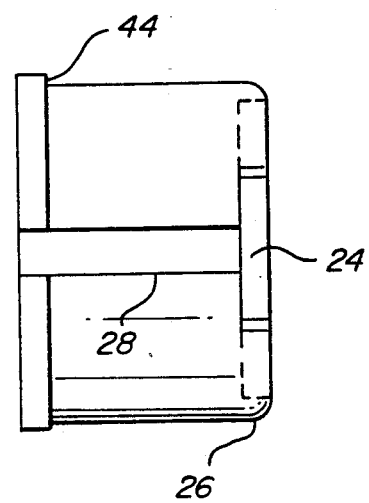
FIGS. 5A and 5B are, respectively, side and front views of the insert plug of the switch assembly of FIG. 1.
Figure 5B:
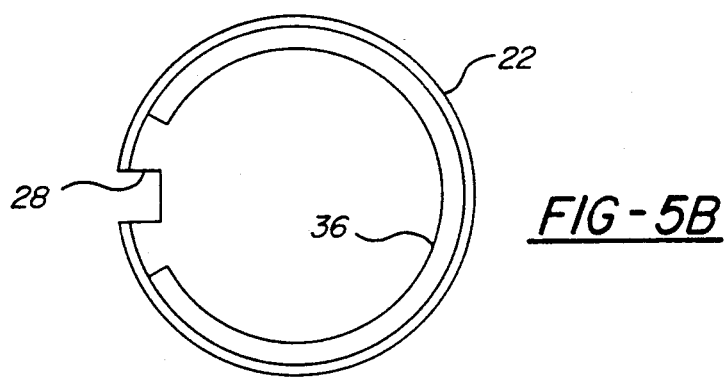

Referring now to FIGS. 5A and 5B, a cylindrical plug 22 is configured to be received in chamber 23. Cylindrical plug 22 has an annular rim 26 formed on a front face thereof to define a hollow recess 24 on the front face of the cylindrical plug 22. Plug 22 further includes an axially extending channel 28 formed on a peripheral surface thereof.

Figure 6:
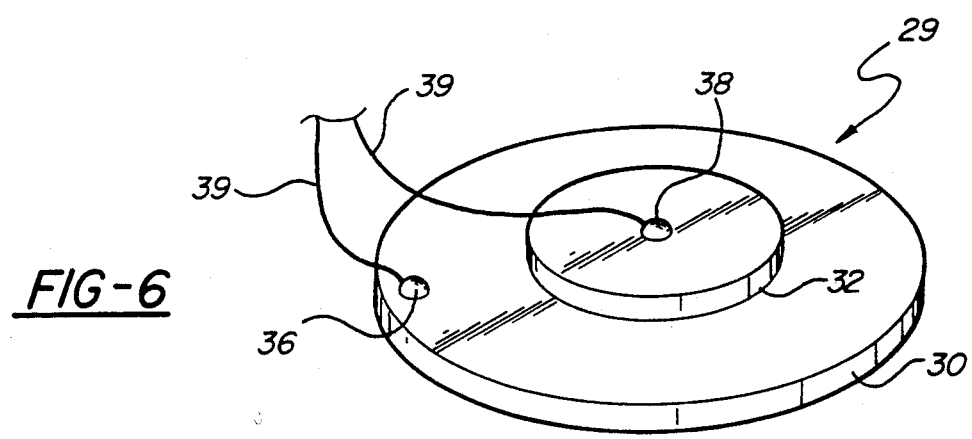
FIG. 6 is a perspective view of the piezoelectric module used in the switch assembly of FIG. 1.

A piezoelectric module 29, which is best seen in FIG. 6, is disposed between the socket 20 and plug 22. Piezoelectric module 29, which is a commercially available unit, includes a carrier disk 30 formed of a deformable, electrically conductive substance. Preferably, carrier disk 30 will be formed of a metallic substance such as brass. Carrier disk 30 is peripherally supported by annular rim 26. A substantially planar wafer 32 of piezoelectric material is mounted approximately coaxially on the carrier disk 30, and overlays and projects into the hollow recess 26. A first electrode 36 is mounted on the piezoelectric wafer 32 and a second electrode 38 is mounted on carrier disk 30. A pair of electrical leads 39 are in electrical communication with the first and second electrodes 36,38 and extend through axial channel 28 formed in plug 22. First and second electrodes 36,38 may be comprised of solder joints formed when leads 39 are attached to, respectively, piezoelectric wafer 32 and brass carrier 29.

A compressible disk 34 is configured to be received in hollow recess 24 between plug 22 and piezoelectric module 29. The purpose of compressible disk 34, which, preferably, is formed of a polymeric foam, is to maintain piezoelectric module 29 in its correct position, with carrier disk 30 being supported on its periphery on the rim 26 of plug 22, and piezoelectric wafer 32, which compresses portions of compressible disk 34, extending into recess 24. Because compressible disk 34 is resilient, slight deformation of piezoelectric wafer 29 caused by pressure on pressure receiving front wall 21 will cause deformation of piezoelectric wafer 32, while the carrier disk 30 remains peripherally supported on rim 26. By means of such an arrangement, the elements comprising switch assembly 10 remain in correct alignment.

The switch assembly 10 includes electronic circuit mounted on circuit board 41 in a conventional manner. This electronic circuit, depicted schematically in FIGS. 7 to 12, is in electrical communication with leads 39 and operative to perform a predetermined switch function upon receipt of an electrical signal generated by piezoelectric wafer 32.

The electronic circuit must recognize the pressure signature of a human finger while remaining relatively insensitive to several noise generators. These noise generators include impact shock, vibration, electrostatic discharge, thermal shock and mechanical stress. Impact shock results if the switch housing or mounting receive a sudden, short mechanical stress. This could result if something were dropped on the switch assembly or its mounting. Piezoelectric modules of this type are generally quite sensitive to high frequency mechanical shock and often generate very high electrical signals in response. Vibration is similar to impact shock except it is generally repetitive or continuous and of lesser intensity. Electrostatic shock causes a noise signal similar to impact shock when an electrostatic discharge occurs upon the switch assembly or its immediate surroundings. Thermal shock results from a sudden change of temperature on the switch assembly. This could occur, for example, if cold water were splashed on the switch assembly. The piezoelectric module generates electrical signals due to both the mechanical stress in the immediate surroundings from thermal expansion/contraction and due to an inherent pyroelectric effect. Most piezoelectric modules exhibit a pyroelectric effect in generation of electrical signals in response to changes in temperature. Mechanical stress can result from stress on the switch assembly mounting, warping of overlays, etc. and commonly comes from thermal stress.

Figure 7:
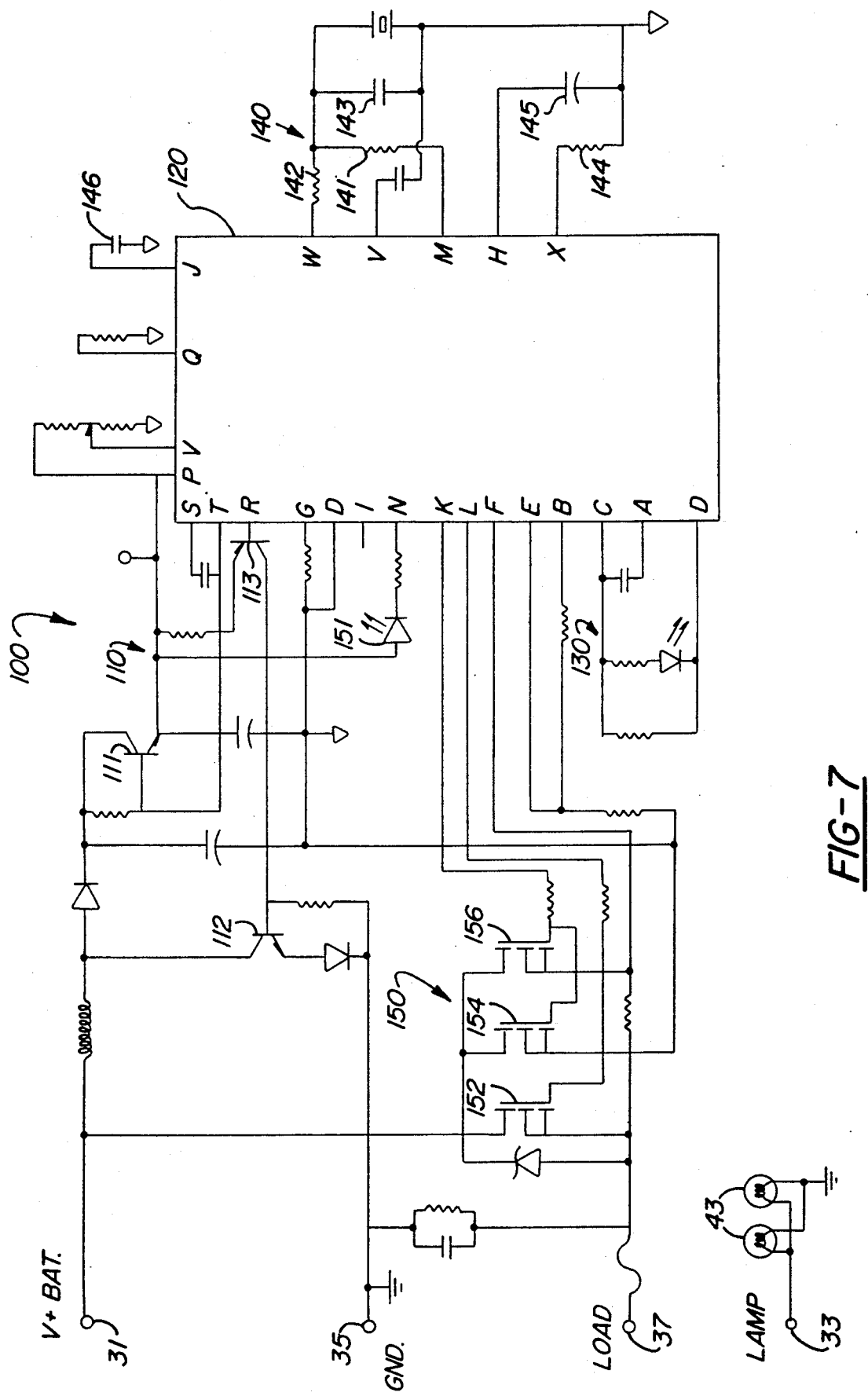
FIG. 7 is a schematic diagram of a circuit arrangement of switching circuitry suitable for use with the switch assembly of FIG. 1, the circuitry providing a plurality of selectable switching functions to be effected upon actuation of the switch assembly.

Circuit 100 depicted in FIG. 7 includes: a power supply section 110; a special purpose integrated circuit 120; an integrator section 130; a piezoelectric sensor front end section 140; and an output section 150 which includes a light emitting diode indicator 151 and field effect power switching transistors 152 and 154.

Circuit 100 is capable of operating in three switch modes: a TOGGLE mode, wherein the switch assembly 10 may be toggled on and off; an OFF/DIM/ON mode wherein the switch assembly 10 may be switched from an off state to a state supplying partial power to the load such as to dim an electric light (not depicted) to a fully on state; and a MOMENTARY mode wherein the load remains powered only as long as pressure is maintained on pressure receiving front wall 21. The voltage connected to a select input at pin I of integrated circuit 100 provides the multiple switching modes. For the toggle mode, the supply voltage $V_{cc}$ is selectively connected to the select input of integrated circuit 100. In the OFF/DIM/ON mode, the select input is connected to a voltage between the supply voltages $V_{cc}$ and $V_{ss}$. A reference voltage is available at pin M which is within this range and the OFF/DIM/ON mode is preferably selected by connecting pins I and M. For the momentary mode, the select input is connected to the supply voltage $V_{ss}$. The operation of switch assembly 10 in each of these modes with be further described below.

Figure 8:
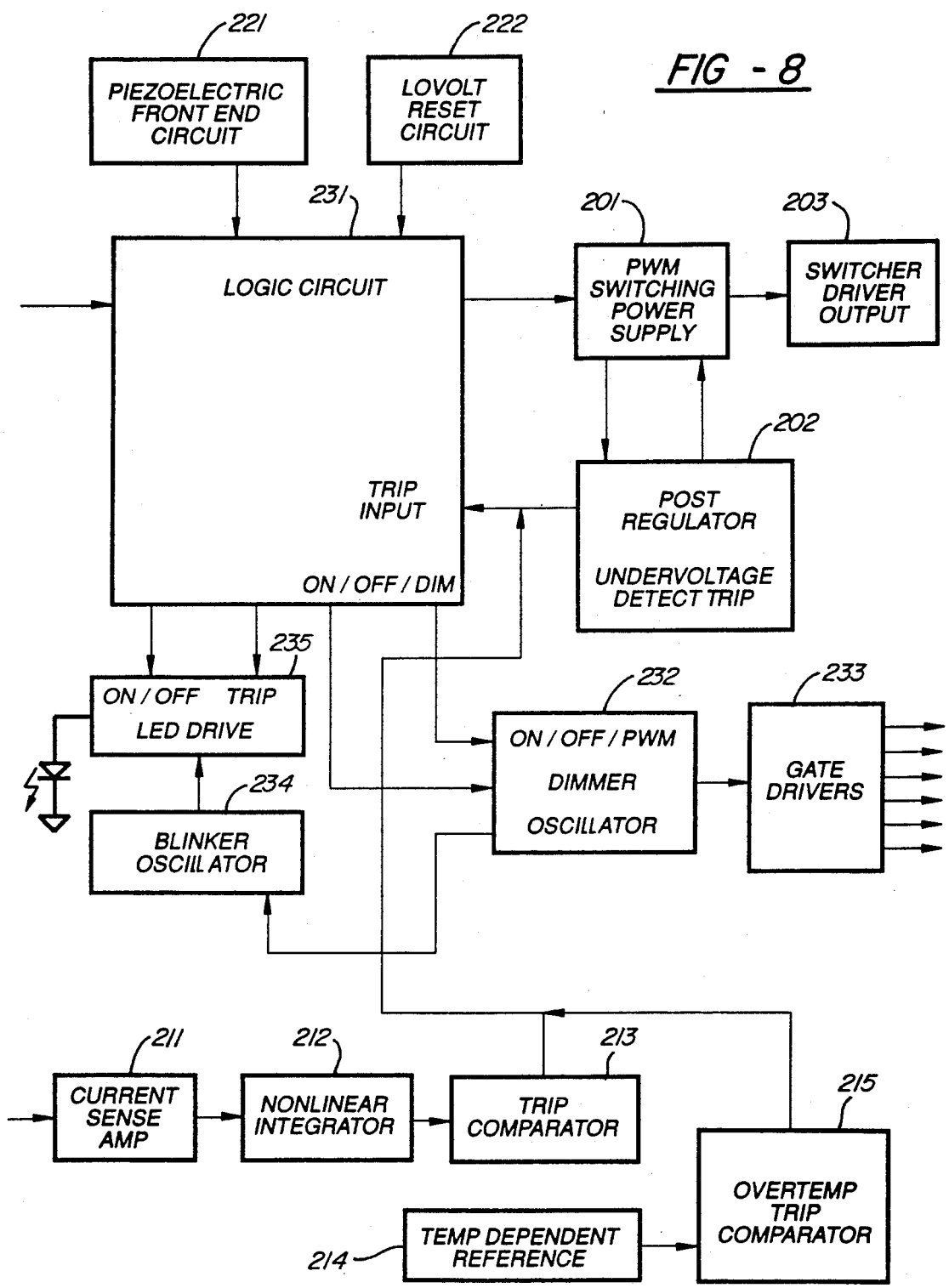
FIG. 8 illustrates in block diagram form the construction of the special purpose integrated circuit illustrated in FIG. 7.

FIG. 8 illustrates in block diagram form the circuits included within integrated circuit 120 illustrated in FIG. 7. This integrated circuit 120 includes: a switching power supply section including pulse width modulated switching power supply 201, post regulator and undervoltage trip circuit 202 and switcher driver output 203; current sense amplifier 211; nonlinear integrator 212; overcurrent trip circuit 213; temperature reference circuit 214; overtemperature trip circuit 215; piezoelectric front end circuit 221; low voltage reset circuit 221; logic circuit 231; OFF/DIM/ON pulse width modulation oscillator 232; gate driver circuit 233; blinker oscillator 234; and light emitting diode driver circuit 235.

Figure 9:
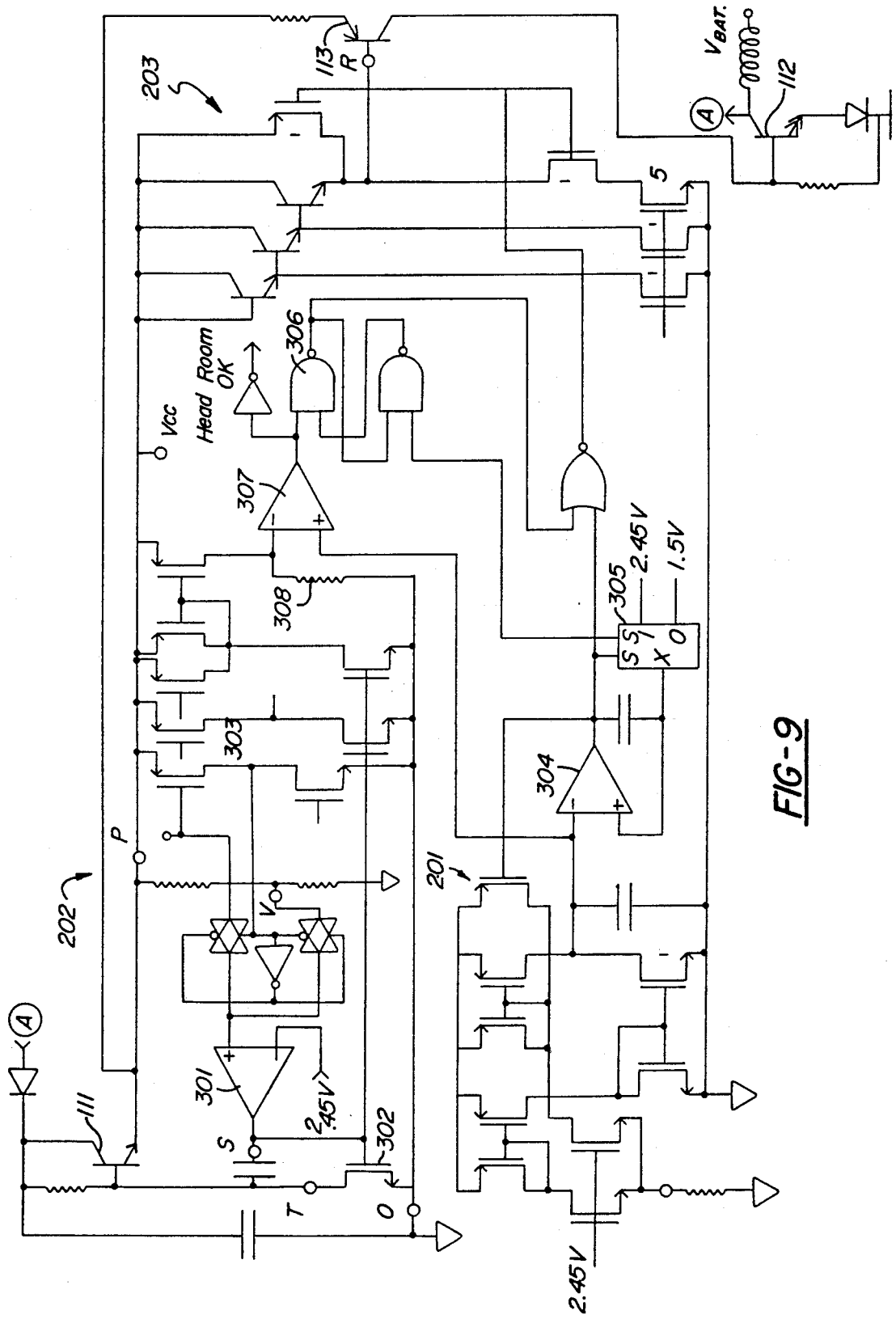
FIG. 9 is a schematic diagram of the power supply portion of the special purpose integrated circuit illustrated in FIG. 7.

A regulated power supply consisting of pulse width modulated switching power supply 201, post regulator and undervoltage trip circuit 202 and switcher driver output 203 together with some of the components of power supply section 110 (see FIG. 7) external to integrated circuit 120 are illustrated in FIG. 9. This regulated power supply is required to safely limit the voltage into integrated circuit 120 and to regulate the supply voltage to 10 volts. There is a voltage adjust input at pin U that if tied to $V_{cc}$ will default to the internally set 10 volt level but if connected to an external resistive divider will set the voltage anywhere from $V_{bndgap}+V_{th}$ (~3.5 volts) and up. The bandgap reference $V_{bndgap}$ is produced by the piezoelectric front end circuit 221 and used as the voltage reference for comparator 301. Note that $V_{th}$ is the field effect transistor threshold voltage.

Comparator 301 drives a field effect transistor 302 having an open drain output at pin T that pulls down the base resistor of the external pass transistor 111. The pass transistor 111 is a darlington with minimum beta of 3000. Input voltage spikes on the collector side of the pass transistor 111 will be on the order of 50 volts. With a 100 kilo-ohm bias resistor the open drain output will need to sink at least 0.5 mA to maintain regulation. It is planned to bypass the output of the pass transistor 111 to the circuit floating ground with a capacitor of about 10 $\mu f$.

The load on the pass transistor 111 is not expected to exceed 10 mA. The worst case load condition is when the TRIP indicator light emitting diode 151 is blinking (3 Hz). Trip indicator light emitting diode 151 is a high efficiency type and will be biased around 2 to 5 mA.

The post regulator 202 output drive is also used via a current mirror 303 to generate an undervoltage trip output should be headroom of the pass transistor 111 ever get too small. This undervoltage trip signal is used by logic circuit 231 to shut down operation.

Pulse width modulated switching power supply 201 and switching driver circuit 203 have a boost topology. The output drive from these circuits is level translated from the floating voltage levels of integrated circuit 120 down to the switching transistor 112 via an external transistor 113. The pulse width modulated switching power supply 201 is based on an oscillator that produces an asymmetric triangle wave with a rising ramp 3 times faster than the falling ramp. This oscillator uses a 4:1 ratio switching current source into an internal capacitor. A comparator 304 has its thresholds set by a 2:1 analog multiplexer 305 so the oscillator runs between 1.5 volts and 2.45 volts (the bandgap voltage $V_{bndgap}$). The oscillator needs to run unaffected by supply voltage down to a $V_{dd}$ of 4 volts. A 75% duty square wave out goes into an RS latch 306. The outer side of RS latch 306 is driven by a comparator 307 that reduces the duty cycle if the drive out of the post regulator exceeds a certain level. Comparator 307 also sets the voltage headroom for the post regulator. A fixed current source is subtracted from a current mirror and the result is fed to a resistor 308 that generates the comparison voltage. This is compared to the pulse width modulator oscillator ramp. If the comparator 307 goes low then R 306 latch is toggled and the ON state of the switcher output is disabled until the next cycle. If the comparison voltage is high enough the switcher duty cycle is reduced to 0% (Off).

The output of the switcher is clamped at 1.5 volts below $V_{dd}$ by transistor clamps. The output needs to drive about 50 $\mu A$ into the base of the level shift transistor 113.

The output of a headroom comparator 307 is also used to enable logic circuit 231 by indicating that a proper working supply voltage has been attained and that the integrated circuit is stabilized. Logic circuit 231 cannot produce a drive to power field effect transistors 152, 154 and 156 without this headroom OK signal.

Figure 10:
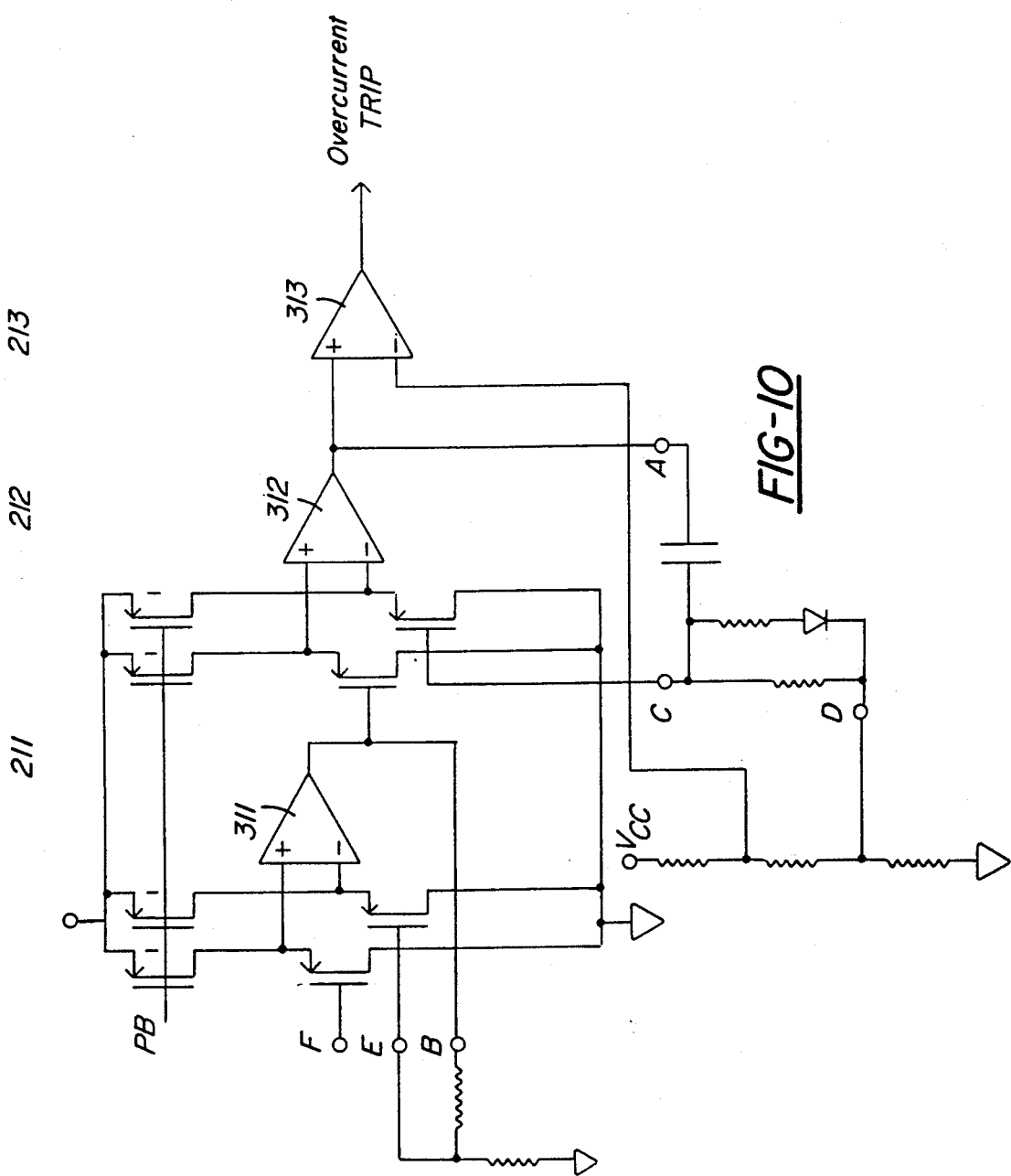
FIG. 10 is a schematic diagram of the overcurrent detector portion of the special purpose integrated circuit illustrated in FIG. 7.
Figure 4:
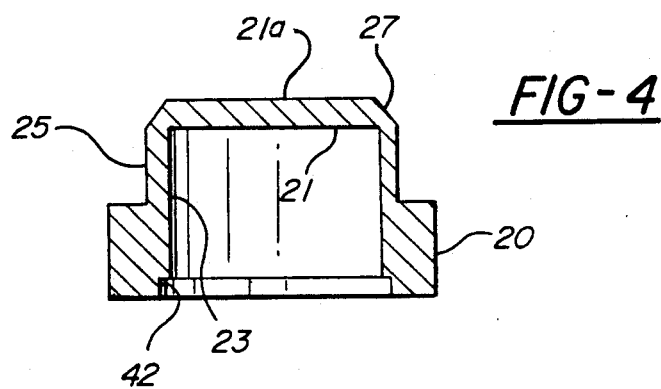
FIG. 4 is a side sectional view of the cup-shaped insert of the switch assembly of FIG. 1.

Current sense amplifier 211, nonlinear integrator 212 and overcurrent trip circuit 213 illustrated in FIG. 10 provide additional circuit and load protection. Current sense amplifier 211 is simply an operational amplifier 311 with 0 volt common mode range that is configured (externally) as a noninverting amplifier with gain of approximately 6. The input to operational amplifier 311 comes from a current sensing resistor connected between the sources of field effect switching transistors 154 and 156. The normal active signal input range is 0 to 2.5 volts. Although the noninverting input can swing to as high as $V_{dd}$, as long as the output of the operational amplifier stays above $V_{dd}-2$ volts during this condition there are no problems. The output of this operational amplifier drives a resistive load on the order of 50 K$\Omega$. The input offset voltage of this operational amplifier should be less than 10% of the 60 mV threshold signal. An input offset voltage of 3 mV is good.

Nonlinear integrator 211 consists of an identical operational amplifier 312 that is configured as a noninverting integrator. The noninverting input is tied to the output of the first operational amplifier 311 via a voltage follower. The input voltage swing will be rail to rail, and operational amplifier 312 should be linear from 0 volts to $V_{dd}-2$ volts, above $V_{dd}-2$ volts the output should remain above $V_{dd}-2$ volts. The output is driving a 0.1 $\mu$F external capacitor into a resistance of approximately 100 kilo-ohm rail to rail.

Both these operational amplifiers 311 and 312 need to have a common mode range that includes ground and a positive slew rate of 2 to 5 volts/$\mu$sec. The output drives must be able to source at least 200 $\mu$A.

Overcurrent trip circuit 213 that follows nonlinear integrator 212 is comparator 313. The characteristics of this comparator 313 are not critical. In fact, it could be simply a P-type field effect transistor with its gate tied to reference voltage and source driven by the output of nonlinear integrator 212. It needs to have a fast positive output edge. The total response time of this circuit to an input step should be less than 5 $\mu$sec but not less than 1 $\mu$sec to avoid false responses to glitches generated during the turn on of power field effect transistors 154 and 156.

Figure 11:
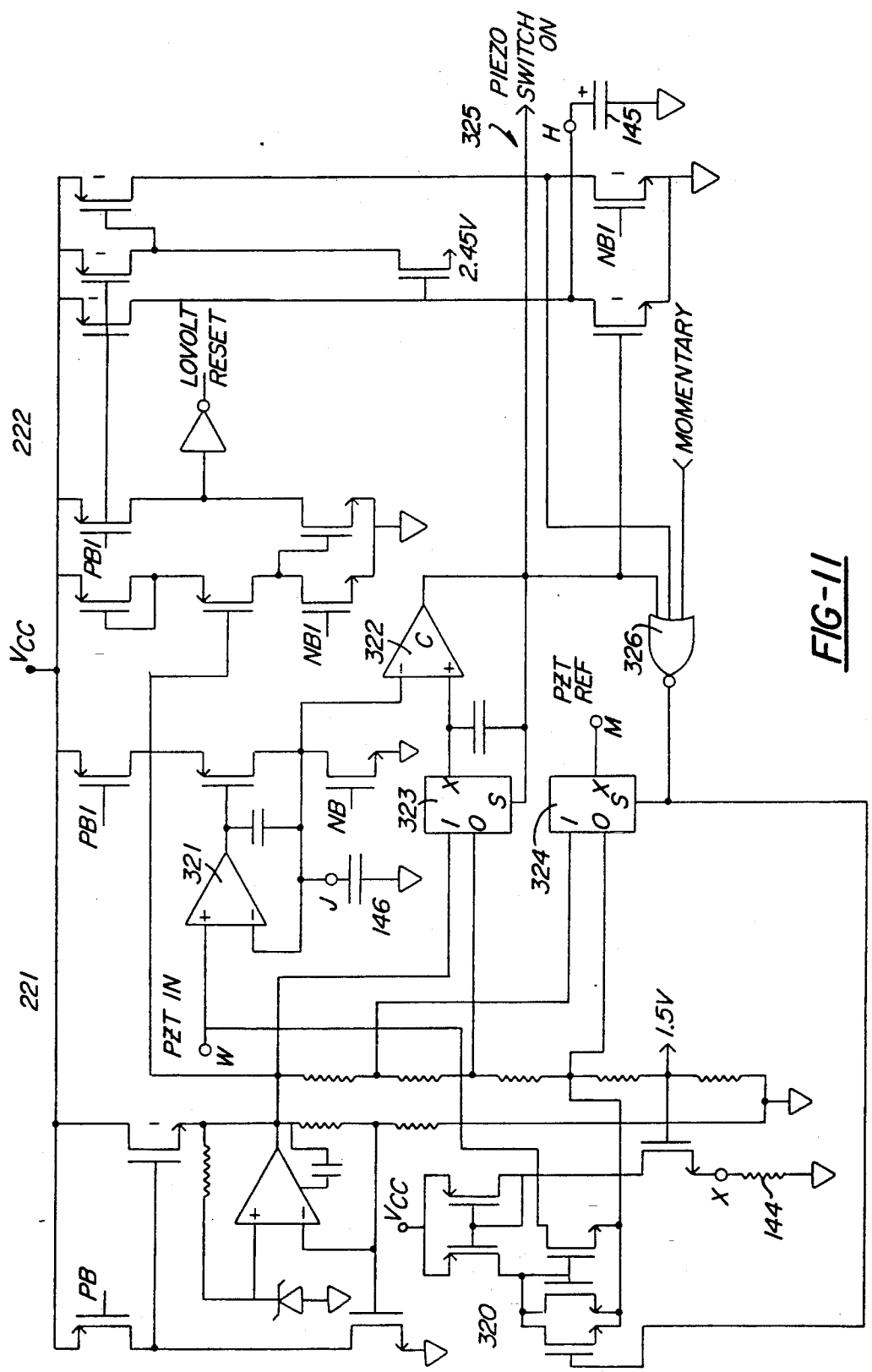
FIG. 11 is a schematic diagram of the piezoelectric front end portion of the special purpose integrated circuit illustrated in FIG. 7.

Piezoelectric front end circuit 221 and low voltage reset circuit 222 are illustrated in FIG. 11. Piezoelectric front end circuit 221 generates a bandgap reference voltage $V_{bndgap}$ used to set the regulator voltage and as a supply independent voltage and current reference. It is also used as the temperature sensor for the overtemperature comparator. Integrated circuit 120 should operate down to 4 volts $V_{dd}$ therefore a ground referenced bandgap with 2.45 volt output was chosen. The voltage out is not that critical, other similar values could be used. This bandgap reference voltage is supplied externally of special purpose integrated circuit 120 via pin M.

A low voltage reset signal is generated by low voltage reset circuit 222 if $V_{dd}$ is less than approximately 1.5 volts above $V_{bndgap}$.

The switch assembly 10 must be able to deal with a very large range of output from piezoelectric module 29. This voltage ranges from a low of about 0.7 volts needed to trigger the switch operation to several hundred volts generated under impact shock. The piezoelectric front end circuitry must not only tolerate this range of output voltages but must also operate consistently without producing false results. Piezoelectric sensor front end section 140 and piezoelectric front end circuit 221 cooperate to provide noise immunity and consistent operation. The maximum current into integrated circuit 120 is limited by resistor 142. Resistor 142 is included primarily to protect integrated circuit 120 from large voltages generated by piezoelectric module 29.

Piezoelectric sensor front end section 140 includes piezoelectric module 29. The negative terminal of piezoelectric module 29 is connected to ground. The positive terminal of piezoelectric module 29 is pulled up to a reference voltage via two conduction paths. First, this terminal of piezoelectric module 29 is connected to the piezoelectric reference voltage (PZT REF) at pin M via resistor 141. Resistor 141 has a high value of within the range of from 1 to 100 M$\Omega$ and preferably within the range from 5 to 20 M$\Omega$. Second, this terminal of the piezoelectric module is connected to a negative current source 320 inside special purpose integrated circuit 120 via pin W and resistor 142. Note that the strength of this current source is set by external resistor 144 connected to pin X. Negative current source 320 pulls down the voltage at pin M to the value of the piezoelectric reference voltage. These small current paths suppress slow drifting of the response of piezoelectric module 29 due to thermal or mechanical stress while not significantly attenuating the more rapid change in voltage when pressure receiving front wall 21 is depressed.

Capacitor 143 is connected across piezoelectric module 29. Capacitor 143 has a capacitance of from 3 to 4 times the capacitance of piezoelectric module 29. This serves to damp the voltage swings observed across piezoelectric module 29 by a factor of 3 to 4. This has the result of requiring firmer pressure on pressure receiving wall 21 to obtain a given output voltage. This also reduces the response to noise, leakage and finger jitter, thereby providing a larger margin between the signal and these noise generators.

Piezoelectric front end circuit 221 includes a high impedance input buffer amplifier 321 having an input connected to piezoelectric module 29 at pin W. The circuits of special purpose integrated circuit 120 are protected from large voltage swings at piezoelectric module 29 by resistor 142. Resistor 142 preferably has a large resistance on the order of several M$\Omega$. Piezoelectric front end circuit 121 may also include voltage clamps. Thus the circuit is protected from large voltage appearing at piezoelectric module 29, such as due to impact shock or electrostatic discharge.

Buffer amplifier 321 is slew rate limited. The maximum slew rate is set by capacitor 146 which is connected to its output via pin J. Thus the maximum rate of change of output of buffer amplifier 321 is limited no matter how fast the input received from piezoelectric module 29 changes. This slew rate is the same in the positive going direction and the negative going direction. The slew rate is preferably set to mask any input signal having a duration less than 30 to 50 milliseconds. This is possible because buffer amplifier 321 cannot respond to such short signals. This also serves to filter out any AC signals appearing across piezoelectric module 29, such as due to vibration or electromagnetic interference, with more than a predetermined frequency set by the maximum slew rate. This does not add any DC bias which would interfere with pressure detection.

The output of buffer amplifier 321 goes into a comparator 322 with hysteresis set by an analog multiplexer 323 that is controlled by the output of comparator 322. The multiplexer 323 selects one of two voltages from a resistor divider. A higher voltage of about 0.7 volts above the reference potential (2.5 volts above ground) is initially selected. The lower voltage of about 0.5 volts above the reference potential (2.3 volts above ground) is selected when comparator 322 trips. Comparator 322 remains tripped until the voltage from the buffer amplifier 321 falls below the lower threshold. The higher comparison voltage is again selected when the capacitor discharges. The hysteresis action of comparator 322 together with the slew rate limitation of buffer amplifier 321 make switch assembly 10 relatively insensitive to switch bouncing due to noisy inputs. The output of comparator 322 is a piezo "Switch On" signal which is used by the logic circuit 231 in the switching function.

Both the slew limited buffer amplifier 321 and the comparator 322 are dealing with signals that are 0.7 volts below the bandgap voltage to $V_{dd}$. As long as these devices are well behaved at voltages above $V_{bndgap}$ they only really have to work up to $V_{bndgap}$ in the linear region.

The prior discussion is relevant to each of the three modes of operation. The MOMENTARY mode requires additional considerations and circuits. Finger pressure on pressure receiving front wall 21 causes piezoelectric module 29 to generate a voltage corresponding to the stress. This voltage generally exceeds the initial threshold voltage of comparator 322. However, the amount of signal generated is very small and even small leakage currents cause the voltage to rapidly decay to below the lower second threshold of comparator 322 even if the pressure continues. Comparator 322 would ordinarily reset in the absence of removal of the pressure. This would prevent the implementation of a momentary contact mode as proposed.

Piezoelectric front end circuit 221 includes two features which enable a momentary contact mode. The PZT REF signal available at pin M is generated by the same resistive divider that generates the thresholds for comparator 322. This PZT REF signal can be 1 of 2 values as selected via analog multiplexer 324. Under all conditions except for MOMENTARY mode the PZT REF signal is a first value called the resting voltage (about 1.8 volts above ground). If switch assembly 10 is in MOMENTARY mode and comparator 322 indicates that pressure receiving front wall 21 is depressed, then the PZT REF signal is switched to 0.6 volts above the resting voltage (2.2 volts above ground). This is 0.1 volts above the enabled lower threshold of comparator 322. Note that in this state NAND gate 326 disables current source 320. Thus the piezoelectric module input at pin W is pulled to the new PZT REF signal level which insures that comparator 322 is tripped. This change in the PZT REF signal keeps comparator 322 tripped while finger pressure continues on pressure receiving front wall 21. Removal of the pressure from pressure receiving front wall 21 causes a negative signal from piezoelectric module 29 sufficient to reset comparator 322. At that time the threshold of comparator 322 is returns to the initial higher voltage, the PZT REF signal returns to the resting voltage and current source 320 is no longer disabled. Thus the piezo switch on signal is active during the interval that pressure is exerted on pressure receiving front wall 21.

An additional circuit is provided to prevent the piezo switch on signal from hanging up. It is possible for the user to release the pressure on pressure receiving front wall 21 so slowly that the negative going signal generated on release is never sufficient to reset comparator 322. If this occurs, then the switch would be stuck on in the MOMENTARY mode even after removal of the pressure. Timeout circuit 325 prevents this possibility. Timeout circuit 325 is enabled whenever comparator 322 indicates pressure receiving front wall 21 is pressed. Timeout circuit 325 starts charging up external capacitor 145 via pin H with a current source. When the capacitor voltage exceeds a threshold, the PZT REF signal is restored to its resting state via NAND gate 326.

This technique ensures that the switch is reset. Thus the piezo switch output remains high until the pressure is released from pressure receiving front wall 21 or the timeout occurs, which ever comes first.

FIG. 12 illustrates logic circuit 231, OFF/DIM/ON pulse width modulation oscillator 232, and blinker oscillator 234. Logic circuit 231 handles the different sequences of states that can be selected via the select pin I. The three modes of operation are TOGGLE, OFF/DIM/ON, and MOMENTARY. If the select input is connected to $V_{dd}$ the TOGGLE mode is selected. If the select input is between $V_{dd}$ and ground the OFF/DIM/ON mode is selected. This is preferably achieved by connection of pins I and M. Lastly, if the select input is grounded the MOMENTARY mode is selected. A voltage comparator 331 detects the voltage level applied to the select input and produces signals for control of the current supplied to the load. Voltage comparator 331 also produces the MOMENTARY signal used by piezoelectric front end circuit 221.

Logic circuit 231 includes a pair of flip-flops 332 and 333 which retain the state selected by the mode and depression of pressure receiving front wall 21. When in the TOGGLE mode only flip-flop 332 is active. Each depression of pressure receiving front wall 21 toggles flip-flop 332, which changes the output via NAND gate 334. Invertor 335 drives the gate driver circuits (not shown). At the same time the NOT Q output of flip-flop 332 causes light emitting diode 151 to be illuminated via NOR gate 336 and invertor 337. The OR gate 338 keeps flip-flop 333 reset when in either the TOGGLE or the OFF/DIM/ON modes.

During the OFF/DIM/ON mode both flip-flops 332 and 333 are active. These two flip-flops are connected in a three state counter. Each depression of pressure receiving front wall 21 advances this counter one state. When in the DIM state, the Q output from flip-flop 333 enables NAND gate 339 to pass the signal from oscillator 340. Oscillator 340 is a square wave oscillator operating at a 40% to 50% duty cycle at about 100 Hz. This drives the gates at the 40% to 50% duty cycle causing a reduced average power to be supplied to the load, such as to dim an electric lamp.

Only flip-flop 332 is active when in the MOMENTARY mode. Initial depression of pressure receiving front wall 21 toggles flip-flop 332 to turn ON the load. Release of the pressure causes NOR gate 341 to reset flip-flop 332 via OR gate 342. Thus switch assembly 10 supplies power to the load only during the time pressure receiving front wall 21 is pressed.

Logic circuit 221 includes a number of safety features. If during DIM or ON states any of the trip inputs (overcurrent, undervoltage, or overtemperature) goes high OR gate 343 toggles flip-flop 344. The NOT Q output of flip-flop 344 removes gate drive via NAND gate 334. This NOT Q output also blinks the light emitting diode 151 by permitting NOR gate 345 to pass the oscillating signal from divider circuit 346 to the driver circuit. Divider circuit 346 includes 5 stages to divide by 32 the signal from oscillator 340. Thus light emitting diode 151 blinks at a rate of about 3.125 Hz. At the same time the connection between flip-flops 332 and 333 is blocked by NOR gates 347 and 348. Logic circuit 221 remains in this trip state for a switch input to clear the trip state. If at any time the LOVOLT RESET goes high both flip-flops 332 and 333 are reset to the OFF state via OR gates 342 and 338, respectively. When changing from the OFF state to the DIM or ON state, gate drive is disabled at NAND gate 334 via RS latch 349 until a sufficient field effect transistor gate drive voltage is available.

Typically, the switch insert 20 and insert plug 22 are formed of a clear polymeric material such as clear polycarbonate. Typically, front cover 12 will be formed of an opaque material. An indicia-bearing surface 40 may be provided which is disposed on a rear surface of pressure receiving front wall 21. Preferably, indicia-bearing surface 40 is comprised of a thin, resilient material such a 10-mil film of white polystyrene with colored or black indicia imprinted thereon. Because socket 20 is formed of clear polycarbonate, indicia-bearing surface 40 will be visible through front wall 21 to the operator of switch assembly 10. Lamp 43 provides backlight through socket 20.

Switch assembly 10, constructed as explained above, possesses certain advantages over the prior art. Purchase components, such as piezoelectric module 29, are used. The purchased piezoelectric modules require no additional shaping or machining. The piezoelectric wafers themselves do not need to fit closely within hollow recess 24. The design allows for size variations. The switch will operate correctly as long as carrier disk 30 remains peripherally supported on rim 26. Any looseness of fit is compensated for by compressible disk 34. Furthermore, the pressure receiving front wall 21 of switch assembly 10 is flush with the front member 12 and, thus, is ideal in situations where a flush switch is desired. For example, the switch of the present invention may be inserted into an article such as a vending machine so that its pressure receiving front wall is flush with the front of the vending machine. Thus, the machine presents a sleek, modern appearance. Furthermore, the interior switch components and delicate piezoelectric material are sealed from the ambient environment since they are encased in clear polymeric material. Thus, the switch of the present invention is especially desirable for applications where a harsh environment is encountered, whether due to humidity, temperature or acts of attempted vandalism.

Assembly of the switch of the present invention is particularly quick and easy. Once the individual components have been provided, resilient disk 34 is inserted into hollow recess 24. Piezoelectric module 29 is then inserted into hollow recess 24 atop foam disk 34 such that piezoelectric wafer 32 projects into hollow recess 24 and carrier disk 30 is peripherally supported by rim 26 of plug 22. Electrical leads 39 are then drawn through channel 28 so that their ends project therefrom. Plug 22 is then inserted into the hollow chamber 23 of switch insert 20. So that plug 22 will positively seat in correct position within hollow chamber 23, an annular groove 42 may be formed on a rear edge of cylindrical cavity 23. A mating annular ring 44 may be formed on a rear face of plug 22 such that, when the plug 22 is inserted into cylindrical cavity 23, mating annular ring 44 seats positively in groove 42, thereby correctly positioning the plug inside the socket.

Socket 20 is inserted into aperture 13 of front member 12 such that tapered seating surface 27 of insert 20 seats positively against tapered annular lip 15, thus bringing the exterior surface 21a of pressure receiving front wall flush 21 with the front surface of front member 12. Electrical leads 39 may then be connected to electronic circuit depicted in FIG. 7. The near end of circuit board 41 is then inserted into slots 45 in front panel 12. Next the body including sides 16 is slipped over circuit board 41 and mated with front panel 12. Lastly, back panel 18 is installed with electrical connectors 31, 33, 35 and 35 protruding through corresponding holes. Switch assembly 10 may then be inserted into a control panel using holes 11. It will be noted that all of the assembly steps require no special fitting or machining and may be performed by assemblers having no special training.

The piezoelectric switch assembly of the present invention has been described with reference to certain embodiments and exemplifications thereof. Doubtless, variations in design may occur to one skilled in the art without departing from the spirit of the present invention. The embodiments and exemplifications described in the present specification are but examples of the practice of the present invention and are not intended to limit the scope thereof. The true scope of the present invention is limited solely by the claims appended hereto.

We claim:

1. A piezoelectric switch assembly comprising:
    a piezoelectric module having first and second electrical leads, said piezoelectric module generating an electrical signal on said first and second electrical leads indicative of manual forces imposed thereon;
    an electronic circuit including
        a sensing means connected to said first and second electrical leads for detection of said electrical signal on said first and second electrical leads, said sensing means including
            a buffer amplifier having an input connected to said first and second electrical leads of said piezoelectric module, and an output having a limited slew rate, and
            a comparator having a first input connected to said output of said buffer amplifier, a second input and an output generating a detection signal when the voltage on said first input exceeds the voltage on said second input, and
            a hysteresis means connected to said second input and said output of said comparator for supplying a first predetermined voltage to said second input of said comparator upon failure to generate said detection signal and for supplying a second predetermined voltage lower than said first predetermined voltage to said second input of said comparator upon generation of said detection signal,
        a toggle means connected to said sensing means and having a plurality of states, said toggle means changeable between said states in a predetermined order upon detection of said electrical signal on said first and second electrical leads, and
        a switch means connected to said toggle means for performing a predetermined switch function corresponding to said state of said toggle means;
    whereby said piezoelectric switch assembly changes switch function upon each manual force imposed on said piezoelectric module.

2. The switch assembly of claim 1, wherein:
    said sensing means further includes
        a reference voltage source generating a reference voltage lower than said second predetermined voltage of said hysteresis means,
        a first resistor having a first terminal connected to said reference voltage source and a second terminal connected to said first electrical lead of said piezoelectric module, said first resistor having a resistance of between 1 and 100 megohms, a second resistor having a first terminal connected to said first electrical lead of said piezoelectric module, and a second terminal, and a negative current source connected to said second terminal of said second resistor for pulling the voltage at said first electrical lead of said piezoelectric module toward said reference voltage via said second resistor.

3. A piezoelectric switch assembly comprising:

a piezoelectric module having first and second electrical leads, said piezoelectric module generating an electrical signal on said first and second electrical leads indicative of manual forces imposed thereon;

an electronic circuit including a sensing means connected to said first and second electrical leads for detection of said electrical signal on said first and second electrical leads, a toggle means connected to said sensing means and having a plurality of states, said toggle means changeable between said states in a predetermined order upon detection of said electrical signal on said first and second electrical leads, said toggle means having a first state and a second state, said toggle means changeable between said first and second states upon each detection of said electrical signal on said first and second electrical leads; and a switch means connected to said toggle means for performing a predetermined switch function corresponding to said state of said toggle means, said switch means being operative to block the conduction of electric current therethrough when said toggle means is in said first state and conduct electric current therethrough when said toggle means is in said second state;

whereby said piezoelectric switch assembly changes between an OFF switch function and an ON switch function upon each manual force imposed on said piezoelectric module.

4. A piezoelectric switch assembly comprising:

a piezoelectric module having first and second electrical leads, said piezoelectric module generating an electrical signal on said first and second electrical leads indicative of manual forces imposed thereon;

an electronic circuit including a sensing means connected to said first and second electrical leads for detection of said electrical signal on said first and second electrical leads, a toggle means connected to said sensing means and having a plurality of states, said toggle means changeable between said states in a predetermined order upon detection of said electrical signal on said first and second electrical leads, said toggle means having a first state, a second state and a third state, said toggle means changeable from said first state to said second state upon detection of said electrical signal on said first and second electrical leads, changeable from said second state to said third state upon detection of said electrical signal on said first and second electrical leads, and changeable from said third state to said first state upon detection of said electrical signal on said first and second electrical leads; and a switch means connected to said toggle means for performing a predetermined switch function corresponding to said state of said toggle means, said switch means being operative to block the conduction of electric current therethrough when said toggle means is in said first state, conduct electric current therethrough when said toggle means is in said third state, and conduct electric current therethrough at a reduced average rate when said toggle means is in said second state;

whereby said switch assembly progresses from an OFF switch function, to a DIM switch function, to an ON switch function, to an OFF switch function upon each manual force imposed on said piezoelectric module.

5. The switch assembly of claim 4, wherein:

said switch means conducts electric current therethrough at said reduced average rate when said toggle means is in said second state by alternating between conducting electric current therethrough and blocking the conduction of electric current therethrough at a predetermined rate.

6. A piezoelectric switch assembly comprising:

a piezoelectric module having first and second electrical leads, said piezoelectric module generating an electrical signal on said first and second electrical leads indicative of manual forces imposed thereon;

an electronic circuit including a sensing means connected to said first and second electrical leads for detection of said electrical signal on said first and second electrical leads, a toggle means connected to said sensing means and having a plurality of states, said toggle means changeable between said states in a predetermined order upon detection of said electrical signal on said first and second electrical leads, said toggle means having a first state and a second state, said toggle means changeable from said first state to said second state upon detection of said electrical signal on said first and second electrical leads, and changeable from said second state to said first state upon failure of detection of said electrical signal on said first and second electrical leads; and a switch means connected to said toggle means for performing a predetermined switch function corresponding to said state of said toggle means, said switch means being operative to block the conduction of electric current therethrough when said toggle means is in said first state and conduct electric current therethrough when said toggle means is in said second state;

whereby said switch assembly changes from an OFF switch function to an ON switch function upon each manual force imposed on said piezoelectric module and changes from the ON switch function back to the OFF switch function upon release of the manual force imposed on the said piezoelectric module.

7. The switch assembly of claim 6, wherein:

said sensing means includes a buffer amplifier having an input connected to said first and second electrical leads of said piezoelectric module, and an output having a limited slew rate, and a comparator having a first input connected to said output of said buffer amplifier, a second input and an output generating a detection signal when the voltage on said first input exceeds the voltage on said second input, a hysteresis means connected to said second input and said output of said comparator for supplying a first predetermined voltage to said second input of said comparator upon failure to generate said detection signal and for supplying a second predetermined voltage lower than said first predetermined voltage to said second input of said comparator upon generation of said detection signal, a reference voltage source generating a reference voltage lower than said second predetermined voltage of said hysteresis means, a first resistor having a first terminal connected to said reference voltage source and a second terminal connected to said first electrical lead of said piezoelectric module, said first resistor having a resistance of between 1 and 100 megohms, a second resistor having a first terminal connected to said first electrical lead of said piezoelectric module, and a second terminal, a negative current source connected to said second terminal of said second resistor for pulling the voltage at said first electrical lead of said piezoelectric module toward said reference voltage via said second resistor, and a momentary control means connected to said comparator, said reference voltage source and said negative current source for changing said reference voltage of said reference voltage source to a voltage above said second predetermined voltage of said hysteresis means and disabling said negative current source upon generation of said detection signal;

whereby said comparator continues to generate said detection signal following each manual force imposed on said piezoelectric module and until release of the manual force imposed on the said piezoelectric module.

8. The switch assembly of claim 7, wherein:

said momentary control means includes a timer means for changing said reference voltage of said reference voltage source back to the original reference voltage and for again enabling said negative current source a predetermined time after initial generation of said detection signal.

9. A piezoelectric switch assembly comprising:

a piezoelectric module having first and second electrical leads, said piezoelectric module generating an electrical signal on said first and second electrical leads indicative of manual forces imposed thereon;

an electronic circuit including a mode selection means operable to select either a first, a second or a third operation mode for said switch assembly, a sensing means connected to said first and second electrical leads for detection of said electrical signal on said first and second electrical leads, a toggle means connected to said sensing means and having a plurality of states, said toggle means changeable between said states in a predetermined order upon detection of said electrical signal on said first and second electrical leads, said toggle means having a first state, a second state and a third state, said toggle means being changeable between said first and second states upon each detection of said electrical signal on said first and second electrical leads when said first operation mode is selected, changeable from said first state to said third state upon detection of said electrical signal on said first and second electrical leads, changeable from said third state to said second state upon detection of said electrical signal on said first and second electrical leads, and changeable from said second state to said first state upon detection of said electrical signal on said first and second electrical leads when said second operation mode is selected, and changeable from said first state to said second state upon detection of said electrical signal on said first and second electrical leads, and changeable from said second state to said first state upon failure of detection of said electrical signal on said first and second electrical leads when said third operation mode is selected, a switch means connected to said toggle means for performing a predetermined switch function corresponding to said state of said toggle means, said switch means being operative to block the conduction of electric current therethrough when said toggle means is in said first state, conduct electric current therethrough when said toggle means is in said second state, and conduct electric current therethrough at a reduced average rate when said toggle means is in said third state;

whereby said switch assembly selectively operates in a first OFF/On operation mode, a second OFF/DIM/ON operation mode or in a third MOMENTARY operation mode.

10. The switch assembly of claim 9, wherein:

said switch means conducts electric current therethrough at said reduced average rate when said toggle means is in said third state and said second operation mode is selected by alternating between conducting electric current therethrough and blocking the conduction of electric current therethrough at a predetermined rate.

11. A piezoelectric switch assembly comprising:

a piezoelectric module having first and second electrical leads, said piezoelectric module generating an electrical signal on said first and second electrical leads indicative of manual forces imposed thereon;

a mode selection means operable to select either one of a plurality of operation modes for said switch assembly;

an electronic circuit electrically connected to said first and second electrical leads of said piezoelectric module and to said mode selection means operative to perform a predetermined switch function corresponding to the selected mode upon receipt of an electrical signal on said first and second electrical leads, said electronic circuit including a sensing means connected to said first and second electrical leads for detection of said electrical signal on said first and second electrical leads, said sensing means including a buffer amplifier having an input connected to said first and second electrical leads of said piezoelectric module, and an output having a limited slew rate, and a comparator having a first input connected to said output of said buffer amplifier, a second input and an output generating a detection signal when the voltage on said first input exceeds the voltage on said second input, and a hysteresis means connected to said second input and said output of said comparator for supplying a first predetermined voltage to said second input of said comparator upon failure to generate said detection signal and for supplying a second predetermined voltage lower than said first predetermined voltage to said second input of said comparator upon generation of said detection signal.

12. The switch assembly of claim 11, wherein:
said sensing means further includes
a reference voltage source generating a reference voltage lower than said second predetermined voltage of said hysteresis means,
a first resistor having a first terminal connected to said reference voltage source and a second terminal connected to said first electrical lead of said piezoelectric module, said first resistor having a resistance of between 1 and 100 megohms,
a second resistor having a first terminal connected to said first electrical lead of said piezoelectric module, and a second terminal, and
a negative current source connected to said second terminal of said second resistor for pulling the voltage at said first electrical lead of said piezoelectric module toward said reference voltage via said second resistor.

13. A piezoelectric switch assembly comprising:
a piezoelectric module having first and second electrical leads, said piezoelectric module generating an electrical signal on said first and second electrical leads indicative of manual forces imposed thereon;
a mode selection means operable to select either one of a plurality of operation modes for said switch assembly, said mode selection means including means for selection of an OFF/ON mode;
an electronic circuit electrically connected to said first and second electrical leads of said piezoelectric module and to said mode selection means operative to perform a predetermined switch function corresponding to the selected mode upon receipt of an electrical signal on said first and second electrical leads, said electronic circuit including
a sensing means connected to said first and second electrical leads for detection of said electrical signal on said first and second electrical leads indicative of manual forces imposed on said piezoelectric module,
a toggle means connected to said sensing means and having a first state and a second state, said toggle means changeable between said first and second states upon each detection of said electrical signal on said first and second electrical leads, and
a switch means connected to said toggle means for blocking the conduction of electric current therethrough when said toggle means is in said first state and conducting electric current therethrough when said toggle means is in said second state;
whereby said switch assembly changes between an OFF switch function and an ON switch function upon each manual force imposed on the exterior surface of said pressure receiving wall.

14. A piezoelectric switch assembly comprising:
a piezoelectric module having first and second electrical leads, said piezoelectric module generating an electrical signal on said first and second electrical leads indicative of manual forces imposed thereon;
a mode selection means operable to select either one of a plurality of operation modes for said switch assembly, said mode selection means including means for selection of an OFF/DIM/ON mode;
an electronic circuit electrically connected to said first and second electrical leads of said piezoelectric module and to said mode selection means operative to perform a predetermined switch function corresponding to the selected mode upon receipt of an electrical signal on said first and second electrical leads, said electronic circuit including
a sensing means connected to said first and second electrical leads for detection of said electrical signal on said first and second electrical leads indicative of manual forces imposed on said piezoelectric module,
a toggle means connected to said sensing means and having a first state, a second state and a third state, said toggle means changeable from said first state to said second state upon detection of said electrical signal on said first and second electrical leads, changeable from said second state to said third state upon detection of said electrical signal on said first and second electrical leads, and changeable from said third state to said first state upon detection of said electrical signal on said first and second electrical leads,
a switch means connected to said toggle means for blocking the conduction of electric current therethrough when said toggle means is in said first state, conducting electric current therethrough when said toggle means is in said third state, and conducting electric current therethrough at a reduced average rate when said toggle means is in said second state;
whereby said switch assembly progresses from an OFF switch function, to a DIM switch function, to an ON switch function, to an OFF switch function upon each manual force imposed on the exterior surface of said pressure receiving wall.

15. The switch assembly of claim 14, wherein:
said switch means conducts electric current therethrough at said reduced average rate when said toggle means is in said second state by alternating between conducting electric current therethrough and blocking the conduction of electric current therethrough at a predetermined rate.

16. A piezoelectric switch assembly comprising:
a piezoelectric module having first and second electrical leads, said piezoelectric module generating an electrical signal on said first and second electrical leads indicative of manual forces imposed thereon;
a mode selection means operable to select either one of a plurality of operation modes for said switch assembly, said mode selection means including means for selection of a MOMENTARY mode;

an electronic circuit electrically connected to said first and second electrical leads of said piezoelectric module and to said mode selection means operative to perform a predetermined switch function corresponding to the selected mode upon receipt of an electrical signal on said first and second electrical leads, said electronic circuit including
a sensing means connected to said first and second electrical leads for detection of said electrical signal on said first and second electrical leads indicative of manual forces imposed on said piezoelectric module,
a toggle means connected to said sensing means and having a first state and a second state, said toggle means changeable from said first state to said second state upon detection of said electrical signal on said first and second electrical leads, and changeable from said second state to said first state upon failure of detection of said electrical signal on said first and second electrical leads,
a switch means connected to said toggle means for blocking the conduction of electric current therethrough when said toggle means is in said first state and conducting electric current therethrough when said toggle means is in said second state;

whereby said switch assembly changes from an OFF switch function to an ON switch function upon each manual force imposed on the exterior surface of said pressure receiving wall and changes from the ON switch function back to the OFF switch function upon release of the manual force imposed on the exterior surface of said pressure receiving wall.

17. A piezoelectric switch assembly comprising:
a piezoelectric module having first and second electrical leads, said piezoelectric module generating an electrical signal on said first and second electrical leads indicative of manual forces imposed thereon;
a mode selection means operable to select either one of a plurality of operation modes for said switch assembly, said mode selection means including means for selection of an OFF/ON mode, an OFF/DIM/ON mode and a MOMENTARY mode;
an electronic circuit electrically connected to said first and second electrical leads of said piezoelectric module and to said mode selection means operative to perform a predetermined switch function corresponding to the selected mode upon receipt of an electrical signal on said first and second electrical leads, said electronic circuit including
a sensing means connected to said first and second electrical leads for detection of said electrical signal on said first and second electrical leads indicative of manual forces imposed on said piezoelectric module,
a toggle means connected to mode selection means and to said sensing means and having a first state, a second state and a third state, said toggle means changeable between said first and second states upon each detection of said electrical signal on said first and second electrical leads when said OFF/ON mode is selected,
changeable from said first state to said third state upon detection of said electrical signal on said first and second electrical leads, changeable from said third state to said second state upon detection of said electrical signal on said first and second electrical leads, and changeable from said second state to said first state upon detection of said electrical signal on said first and second electrical leads when said OFF/DIM/ON mode is selected, and
changeable from said first state to said second state upon detection of said electrical signal on said first and second electrical leads, and changeable from said second state to said first state upon failure of detection of said electrical signal on said first and second electrical leads when said MOMENTARY mode is selected,
a switch means connected to said toggle means for blocking the conduction of electric current therethrough when said toggle means is in said first state, conducting electric current therethrough when said toggle means is in said second state, and conducting electric current therethrough at a reduced average rate when said toggle means is in said third state;

whereby said switch assembly selectively operates in an OFF/ON mode, an OFF/DIM/ON operation mode or in a MOMENTARY mode.

18. The switch assembly of claim 17, wherein:
said switch means conducts electric current therethrough at said reduced average rate when said toggle means is in said third state and said OFF/DIM/ON mode is selected by alternating between conducting electric current therethrough and blocking the conduction of electric current therethrough at a predetermined rate.

19. The switch assembly of claim 17, wherein: said electronic circuit includes
a sensing means connected to said first and second electrical leads for detection of said electrical signal on said first and second electrical leads, said sensing means including
a buffer amplifier having an input connected to said first and second electrical leads of said piezoelectric module, and an output having a limited slew rate, and
a comparator having a first input connected to said output of said buffer amplifier, a second input and an output generating a detection signal when the voltage on said first input exceeds the voltage on said second input,
a hysteresis means connected to said second input and said output of said comparator for supplying a first predetermined voltage to said second input of said comparator upon failure to generate said detection signal and for supplying a second predetermined voltage lower than said first predetermined voltage to said second input of said comparator upon generation of said detection signal,
a reference voltage source generating a reference voltage lower than said second predetermined voltage of said hysteresis means,
a first resistor having a first terminal connected to said reference voltage source and a second terminal connected to said first electrical lead of said piezoelectric module, said first resistor having a resistance of between 5 and 20 megohms,
a second resistor having a first terminal connected to said first electrical lead of said piezoelectric module, and a second terminal,
a negative current source connected to said second terminal of said second resistor for pulling the voltage at said first electrical lead of said piezoelectric module toward said reference voltage via said second resistor, and a momentary control means connected to said mode selection means, said comparator, said reference voltage source and said negative current source for changing said reference voltage of said reference voltage source to a voltage above said second predetermined voltage of said hysteresis means and disabling said negative current source upon generation of said detection signal when in said MOMENTARY mode.

20. The switch assembly of claim 19, wherein: said momentary control means includes a timer means for changing said reference voltage of said reference voltage source back to the original reference voltage and for again enabling said negative current source a predetermined time after initial generation of said detection signal.

* * * * *